(12) United States Patent
Huang (10) Patent No.: US 9,991,879 B2
(45) Date of Patent: Jun. 5, 2018

(54) APPARATUS FOR DETECTING VARIATION IN TRANSISTOR THRESHOLD VOLTAGE

(71) Applicant: MediaTek Inc., Hsin-Chu (TW)

(72) Inventor: Bo-Jr Huang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 51 days.

(21) Appl. No.: 15/134,954

(22) Filed: Apr. 21, 2016

(65) Prior Publication Data

US 2017/0149423 A1    May 25, 2017

Related U.S. Application Data

(60) Provisional application No. 62/258,581, filed on Nov. 23, 2015.

(51) Int. Cl.
*H03K 3/03* (2006.01)
*H03K 5/19* (2006.01)
*G01R 31/26* (2014.01)

(52) U.S. Cl.
CPC .......... *H03K 5/19* (2013.01); *G01R 31/2621* (2013.01); *H03K 3/0315* (2013.01)

(58) Field of Classification Search
CPC .......... H03K 3/0315; H03K 5/19; H03L 7/00
USPC .......... 331/57, 158; 327/261, 264
See application file for complete search history.

(56) References Cited

U.S. PATENT DOCUMENTS

| | | | | |
|---|---|---|---|---|
| 5,545,941 A | * | 8/1996 | Soneda | H03K 3/3545 310/318 |
| 7,570,093 B1 | | 8/2009 | Huang | |
| 7,609,041 B2 | | 10/2009 | Hsieh et al. | |
| 2006/0232346 A1 | * | 10/2006 | Ouici | H03K 3/0315 331/57 |

FOREIGN PATENT DOCUMENTS

| | | |
|---|---|---|
| TW | 200418261 | 9/2004 |
| TW | 200805028 | 1/2008 |
| TW | 200941947 | 10/2009 |
| TW | 2009417947 | 10/2009 |

* cited by examiner

*Primary Examiner* — Arnold Kinkead
(74) *Attorney, Agent, or Firm* — McClure, Qualey & Rodack, LLP (57) ABSTRACT

A ring oscillator includes a plurality of inverters. A closed loop structure is formed by cascading the inverters. The inverter includes at least one sensitive inverter with a diode-connected transistor. A variation in an MOSFET (Metal Oxide Semiconductor Field Effect Transistor) threshold voltage of the ring oscillator is detected by analyzing the oscillation frequency of the ring oscillator.

7 Claims, 5 Drawing Sheets

APPARATUS FOR DETECTING VARIATION IN TRANSISTOR THRESHOLD VOLTAGE

CROSS REFERENCE TO RELATED APPLICATIONS

This application claims the benefit of U.S. Provisional Application No. 62/258,581, filed on Nov. 23, 2015, the entirety of which is incorporated by reference herein.

BACKGROUND OF THE INVENTION

Field of the Invention

The disclosure generally relates to an apparatus for detecting a variation in a transistor threshold voltage.

Description of the Related Art

In the field of semiconductor manufacturing, there is a gap between simulation and practical measurement, caused mainly by PVT (Process, Voltage, and Thermal) variations. In the MOSFET (Metal Oxide Semiconductor Field Effect Transistor) manufacturing process, the most relevant parameter to PVT variation is the MOSFET threshold voltage. As a result, there is the need to design a sensitive detection circuit for monitoring variations in the MOSFET threshold voltage.

BRIEF SUMMARY OF THE INVENTION

In a preferred embodiment, the invention is directed to an N-type inverter including a PMOS transistor (P-type Metal Oxide Semiconductor Field Effect Transistor), a first NMOS transistor (N-type Metal Oxide Semiconductor Field Effect Transistor), and a second NMOS transistor. The PMOS transistor has a control terminal coupled to an input node of the N-type inverter, a first terminal coupled to a supply voltage, and a second terminal coupled to an output node of the N-type inverter. The first NMOS transistor has a control terminal coupled to the input node, a first terminal coupled to an inner node, and a second terminal coupled to the output node. The second NMOS transistor has a control terminal coupled to the inner node, a first terminal coupled to a ground voltage, and a second terminal coupled to the inner node.

In another preferred embodiment, the invention is directed to a P-type inverter including a first PMOS transistor (P-type Metal Oxide Semiconductor Field Effect Transistor), a second PMOS transistor, and an NMOS transistor (N-type Metal Oxide Semiconductor Field Effect Transistor). The first PMOS transistor has a control terminal coupled to an inner node, a first terminal coupled to a supply voltage, and a second terminal coupled to the inner node. The second PMOS transistor has a control terminal coupled to an input node of the P-type inverter, a first terminal coupled to the inner node, and a second terminal coupled to an output node of the P-type inverter. The NMOS transistor has a control terminal coupled to the input node, a first terminal coupled to a ground voltage, and a second terminal coupled to the output node.

In a preferred embodiment, the invention is directed to a delay chain including a plurality of inverters. The inverters are coupled in series. The inverters include at least one sensitive inverter with a diode-connected transistor.

In some embodiments, the sensitive inverter is an N-type inverter or a P-type inverter. In some embodiments, the N-type inverter includes a PMOS transistor (P-type Metal Oxide Semiconductor Field Effect Transistor), a first NMOS transistor (N-type Metal Oxide Semiconductor Field Effect Transistor), and a second NMOS transistor. The PMOS transistor has a control terminal coupled to an input node of the N-type inverter, a first terminal coupled to a supply voltage, and a second terminal coupled to an output node of the N-type inverter. The first NMOS transistor has a control terminal coupled to the input node, a first terminal coupled to an inner node, and a second terminal coupled to the output node. The second NMOS transistor has a control terminal coupled to the inner node, a first terminal coupled to a ground voltage, and a second terminal coupled to the inner node. In some embodiments, the P-type inverter includes a first PMOS transistor (P-type Metal Oxide Semiconductor Field Effect Transistor), a second PMOS transistor, and an NMOS transistor (N-type Metal Oxide Semiconductor Field Effect Transistor). The first PMOS transistor has a control terminal coupled to an inner node, a first terminal coupled to a supply voltage, and a second terminal coupled to the inner node. The second PMOS transistor has a control terminal coupled to an input node of the P-type inverter, a first terminal coupled to the inner node, and a second terminal coupled to an output node of the P-type inverter. The NMOS transistor has a control terminal coupled to the input node, a first terminal coupled to a ground voltage, and a second terminal coupled to the output node. In some embodiments, each of the inverters is implemented with the sensitive inverter. In some embodiments, a variation in an MOSFET (Metal Oxide Semiconductor Field Effect Transistor) threshold voltage of the delay chain is detected by analyzing the total delay time of the delay chain. In some embodiments, if the total delay time of the delay chain increases, it means that the MOSFET threshold voltage becomes higher, and if the total delay time of the delay chain decreases, it means that the MOSFET threshold voltage becomes lower.

In another preferred embodiment, the invention is directed to a ring oscillator including a plurality of inverters. The inverters include at least one sensitive inverter with a diode-connected transistor. A closed loop structure is formed by cascading the inverters.

In some embodiments, the sensitive inverter is an N-type inverter or a P-type inverter. In some embodiments, the N-type inverter includes a PMOS transistor (P-type Metal Oxide Semiconductor Field Effect Transistor), a first NMOS transistor (N-type Metal Oxide Semiconductor Field Effect Transistor), and a second NMOS transistor. The PMOS transistor has a control terminal coupled to an input node of the N-type inverter, a first terminal coupled to a supply voltage, and a second terminal coupled to an output node of the N-type inverter. The first NMOS transistor has a control terminal coupled to the input node, a first terminal coupled to an inner node, and a second terminal coupled to the output node. The second NMOS transistor has a control terminal coupled to the inner node, a first terminal coupled to a ground voltage, and a second terminal coupled to the inner node. In some embodiments, the P-type inverter includes a first PMOS transistor (P-type Metal Oxide Semiconductor Field Effect Transistor), a second PMOS transistor, and an NMOS transistor (N-type Metal Oxide Semiconductor Field Effect Transistor). The first PMOS transistor has a control terminal coupled to an inner node, a first terminal coupled to a supply voltage, and a second terminal coupled to the inner node. The second PMOS transistor has a control terminal coupled to an input node of the P-type inverter, a first terminal coupled to the inner node, and a second terminal coupled to an output node of the P-type inverter. The NMOS transistor has a control terminal coupled to the input node, a first terminal coupled to a ground voltage, and a second terminal coupled to the output node. In some embodiments, each of the inverters is implemented with the sensitive inverter. In some embodiments, the ring oscillator further includes a control gate. The control gate is embedded in the closed loop structure of the inverters. The control gate is configured to selectively enable or disable the ring oscillator. In some embodiments, a variation in an MOSFET (Metal Oxide Semiconductor Field Effect Transistor) threshold voltage of the ring oscillator is detected by analyzing an oscillation frequency of the ring oscillator. In some embodiments, if the oscillation frequency of the ring oscillator increases, it means that the MOSFET threshold voltage becomes lower, and if the oscillation frequency of the ring oscillator decreases, it means that the MOSFET threshold voltage becomes higher.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

In order to illustrate the purposes, features and advantages of the invention, the embodiments and figures of the invention will be described in detail as follows.

Figure 1:
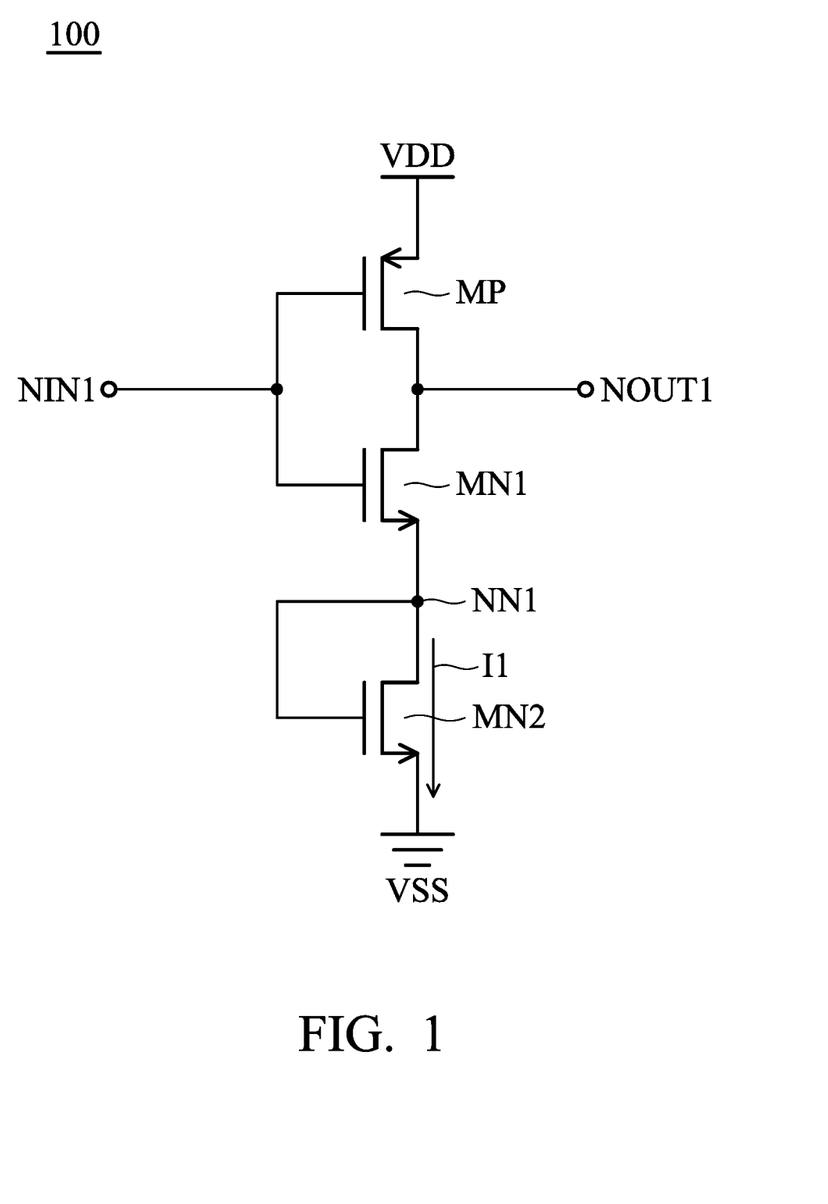
FIG. 1 is a diagram of an N-type inverter according to an embodiment of the invention.

FIG. 1 is a diagram of an N-type inverter 100 according to an embodiment of the invention. The N-type inverter 100 has an input node NIN1 and an output node NOUT1. As shown in FIG. 1, the N-type inverter 100 includes a PMOS transistor (P-type Metal Oxide Semiconductor Field Effect Transistor) MP, a first NMOS transistor (N-type Metal Oxide Semiconductor Field Effect Transistor) MN1, and a second NMOS transistor MN2. The PMOS transistor MP has a control terminal coupled to the input node NIN1, a first terminal coupled to a supply voltage VDD, and a second terminal coupled to the output node NOUT1. The first NMOS transistor MN1 has a control terminal coupled to the input node NIN1, a first terminal coupled to an inner node NN1, and a second terminal coupled to the output node NOUT1. The second NMOS transistor MN2 has a control terminal coupled to the inner node NN1, a first terminal coupled to a ground voltage VSS, and a second terminal coupled to the inner node NN1.

In the embodiment of FIG. 1, the second NMOS transistor MN2 is a diode-connected transistor. The second NMOS transistor MN2 always operates in a saturation mode, and it is configured as a first current source for conducting a first current I1. The first current I1 is considered as a charging/discharging current of the N-type inverter 100. The magnitude of the first current I1 is calculated according to the following equation (1).

$$I1 = K_N \times (V_{GS} - V_{tN})^2 \qquad (1)$$

where "$K_N$" represents a conduction parameter for N-channel, "$V_{GS}$" represents a voltage difference between the control terminal (gate) and the first terminal (source) of the second NMOS transistor NM2, and "$V_{tN}$" represents a threshold voltage of the second NMOS transistor MN2.

Ideally, each PMOS transistor and each NMOS transistor in the N-type inverter 100 have the same MOSFET (Metal Oxide Semiconductor Field Effect Transistor) threshold voltage. According to the equation (1), the charging/discharging current (i.e., the first current I1) of the N-type inverter 100 is determined according to the quadratic term of the MOSFET threshold voltage (e.g., $V_{tN}^2$). With such a design, the operation speed of the N-type inverter 100 is sensitive to the variation in the MOSFET threshold voltage. Specifically, if the MOSFET threshold voltage (e.g., $V_{tN}$) becomes higher, the charging/discharging current of the N-type inverter 100 will become much smaller, thereby significantly decreasing the operation speed of the N-type inverter 100; otherwise, if the MOSFET threshold voltage (e.g., $V_{tN}$) becomes lower, the charging/discharging current of the N-type inverter 100 will become much larger, thereby significantly increasing the operation speed of the N-type inverter 100. It should be noted that the aforementioned operation speed of the N-type inverter 100 may be proportional to the reciprocal of the switching delay time of the N-type inverter 100. In some embodiments, the variation in the MOSFET threshold voltage of the N-type inverter 100 is detected by monitoring and analyzing the operation speed or the switching delay time of the N-type inverter 100.

Figure 2:
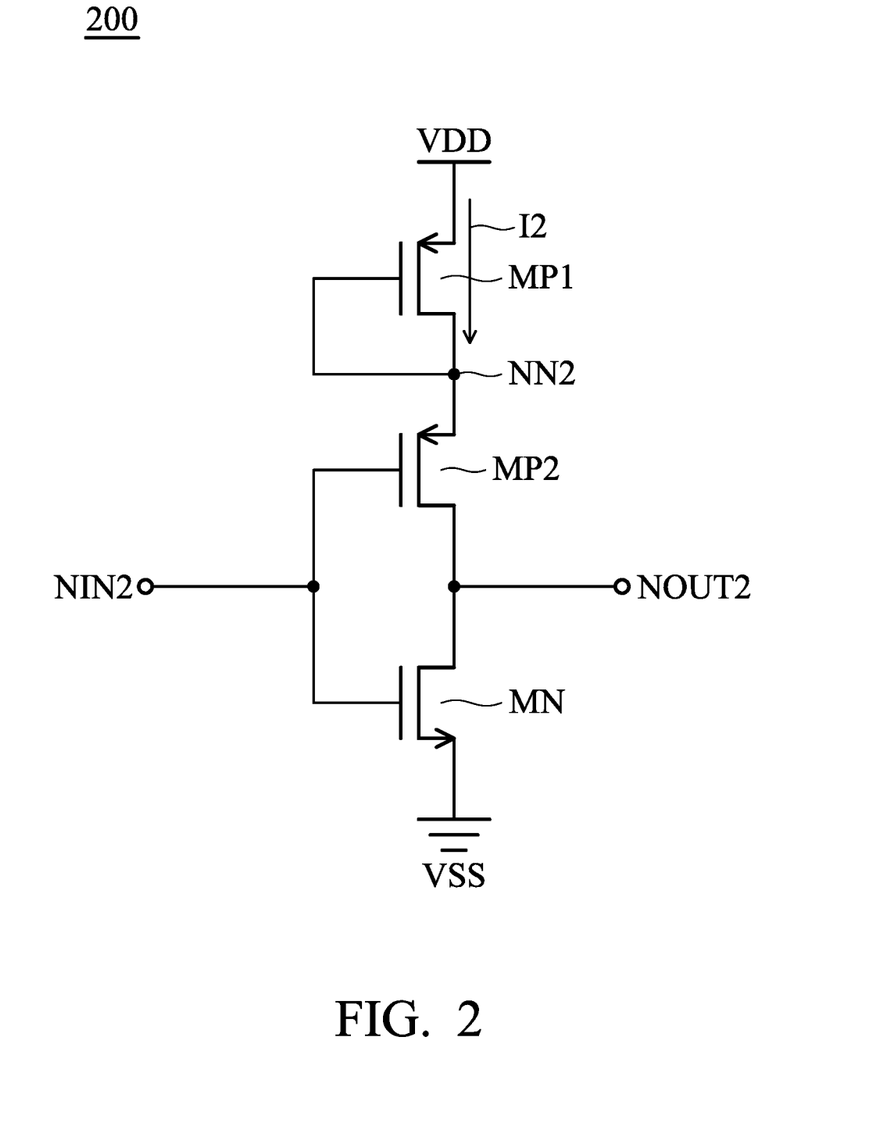
FIG. 2 is a diagram of a P-type inverter according to an embodiment of the invention.

FIG. 2 is a diagram of a P-type inverter 200 according to an embodiment of the invention. The P-type inverter 200 has an input node NIN2 and an output node NOUT2. As shown in FIG. 2, the P-type inverter 200 includes a first PMOS transistor MP1, a second PMOS transistor MP2, and an NMOS transistor MN. The first PMOS transistor MP1 has a control terminal coupled to an inner node NN2, a first terminal coupled to a supply voltage VDD, and a second terminal coupled to the inner node NN2. The second PMOS transistor MP2 has a control terminal coupled to the input node NIN2, a first terminal coupled to the inner node NN2, and a second terminal coupled to the output node NOUT2. The NMOS transistor MN has a control terminal coupled to the input node NIN2, a first terminal coupled to a ground voltage VSS, and a second terminal coupled to the output node NOUT2.

In the embodiment of FIG. 2, the first PMOS transistor MP1 is a diode-connected transistor. The first PMOS transistor MP1 always operates in a saturation mode, and it is configured as a second current source for conducting a second current I2. The second current I2 is considered as a charging/discharging current of the P-type inverter 200. The magnitude of the second current I2 is calculated according to the following equation (2).

$$I2 = K_P \times (V_{SG} - |V_{tP}|)^2 \qquad (2)$$

where "$K_P$" represents a conduction parameter for P-channel, "$V_{SG}$" represents a voltage difference between the first terminal (source) and the control terminal (gate) of the first PMOS transistor MP1, and "$|V_{tP}|$" represents a threshold voltage (absolute value) of the first PMOS transistor MP1.

Ideally, each PMOS transistor and each NMOS transistor in the P-type inverter 200 have the same MOSFET threshold voltage. According to the equation (2), the charging/discharging current (i.e., the second current I2) of the P-type inverter 200 is determined according to the quadratic term of the MOSFET threshold voltage (e.g., $|V_{tP}|^2$). With such a design, the operation speed of the P-type inverter 200 is sensitive to the variation in the MOSFET threshold voltage. Specifically, if the MOSFET threshold voltage (e.g., $|V_{tP}|^2$) becomes higher, the charging/discharging current of the P-type inverter 200 will become much smaller, thereby significantly decreasing the operation speed of the P-type inverter 200; otherwise, if the MOSFET threshold voltage (e.g., $|V_{tP}|$) becomes lower, the charging/discharging current of the P-type inverter 200 will become much larger, thereby significantly increasing the operation speed of the P-type inverter 200. It should be noted that the aforementioned operation speed of the P-type inverter 200 may be proportional to the reciprocal of the switching delay time of the P-type inverter 200. In some embodiments, the variation in the MOSFET threshold voltage of the P-type inverter 200 is detected by monitoring and analyzing the operation speed or the switching delay time of the P-type inverter 200.

A conventional inverter without any diode-connected transistor conducts a charging/discharging current when its transistors operate in a triode mode. As a result, the charging/discharging current of the conventional inverter is determined according to the linear term of the MOSFET threshold voltage (e.g., $V_{tN}$ or $|V_{tP}|$), and it is less sensitive to the variation in the MOSFET threshold voltage than the proposed N-type inverter 100 and P-type inverter 200.

Figure 3:
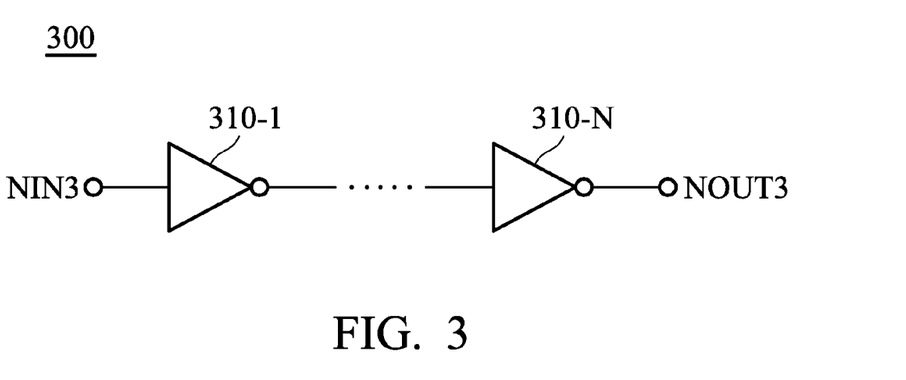
FIG. 3 is a diagram of a delay chain according to an embodiment of the invention.

FIG. 3 is a diagram of a delay chain 300 according to an embodiment of the invention. As shown in FIG. 3, the delay chain 300 with an input node NIN3 and an output node NOUT3 includes a plurality of inverters 310-1, . . . , and 310-N ("N" is a positive integer which is equal to or greater than 1). The inverters 310-1, . . . , and 310-N are coupled in series. The inverters 310-1, . . . , and 310-N include at least one sensitive inverter with a diode-connected transistor. In some embodiments, each of the inverters 310-1, . . . , and 310-N is implemented with a respective sensitive inverter. The sensitive inverter may be the N-type inverter 100 or the P-type inverter 200. The structures and functions of the N-type inverter 100 and the P-type inverter 200 have been described in the embodiments of FIG. 1 and FIG. 2. Ideally, each of the inverters 310-1, . . . , and 310-N have the same MOSFET threshold voltage. As mentioned above, the operation speed of the sensitive inverter is sensitive to the variation in the MOSFET threshold voltage (e.g., $V_{tN}$ or $|V_{tP}|$). Therefore, the variation in the MOSFET threshold voltage of the delay chain 300 is detected by monitoring and analyzing a total delay time of the delay chain 300. The total delay time of the delay chain 300 may be a delay time of signal transmission from the input node NIN3 to output node NOUT3. Specifically, if the total delay time of the delay chain 300 increases, it may mean that the MOSFET threshold voltage becomes higher so that the charging/discharging current of the sensitive inverter becomes smaller; otherwise, if the total delay time of the delay chain 300 decreases, it may mean that the MOSFET threshold voltage becomes lower so that the charging/discharging current of the sensitive inverter becomes larger.

Figure 4:
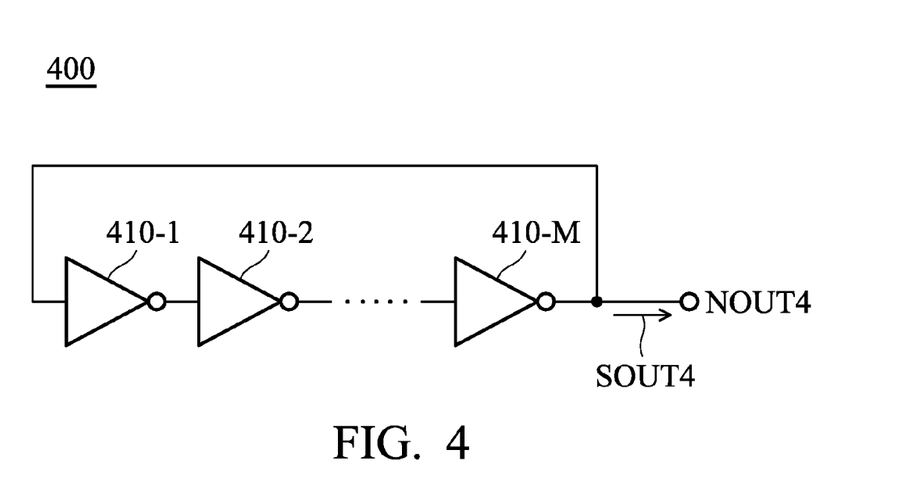
FIG. 4 is a diagram of a ring oscillator according to an embodiment of the invention.

FIG. 4 is a diagram of a ring oscillator 400 according to an embodiment of the invention. As shown in FIG. 4, the ring oscillator 400 with an input node NIN4 and an output node NOUT4 includes a plurality of inverters 410-1, 410-2, . . . , and 410-M ("M" is an odd number which is equal to or greater than 3). A closed loop structure is formed by cascading the inverters 410-1, 410-2, . . . , and 410-M. The inverters 410-1, 410-2, . . . , and 410-M includes at least one sensitive inverter with a diode-connected transistor. In some embodiments, each of the inverters 410-1, 410-2, . . . , and 410-M is implemented with a respective sensitive inverter. The sensitive inverter may be the N-type inverter 100 or the P-type inverter 200. The structures and functions of the N-type inverter 100 and the P-type inverter 200 have been described in the embodiments of FIG. 1 and FIG. 2. Ideally, each of the inverters 410-1, 410-2, . . . , and 410-M have the same MOSFET threshold voltage. As mentioned above, the operation speed of the sensitive inverter is sensitive to the variation in the MOSFET threshold voltage (e.g., $V_{tN}$ or $|V_{tP}|$). Therefore, the variation in the MOSFET threshold voltage of the ring oscillator 400 is detected by monitoring and analyzing an oscillation frequency of the ring oscillator 400. The oscillation frequency of the ring oscillator 400 may be the frequency of an output signal SOUT4 at the output node NOUT4. It should be noted that the aforementioned oscillation frequency of the ring oscillator 400 may be proportional to the reciprocal of the total delay time of the inverters 410-1, 410-2, . . . , and 410-M. Specifically, if the oscillation frequency of the ring oscillator 400 increases, it may mean that the MOSFET threshold voltage becomes lower so that the charging/discharging current of the sensitive inverter becomes larger; otherwise, if the oscillation frequency of the ring oscillator 400 decreases, it may mean that the MOSFET threshold voltage becomes higher so that the charging/discharging current of the sensitive inverter becomes smaller.

Figure 5:
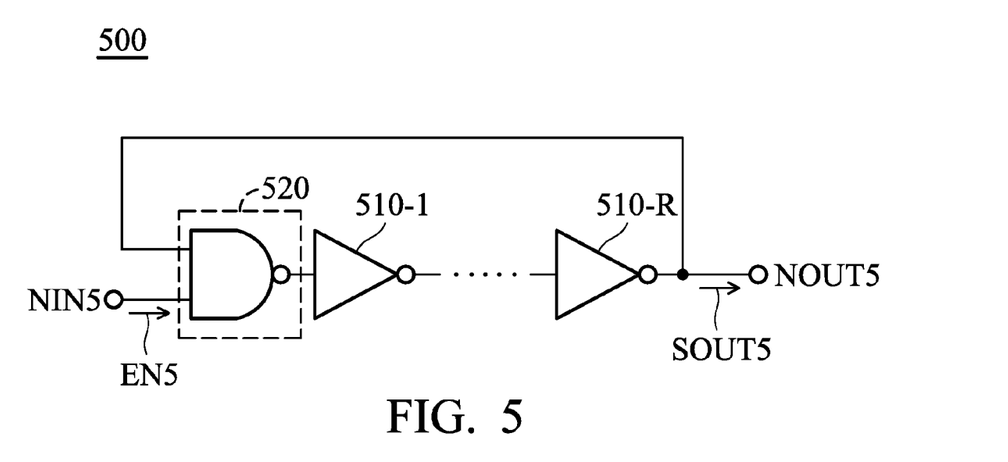
FIG. 5 is a diagram of a ring oscillator according to an embodiment of the invention.

FIG. 5 is a diagram of a ring oscillator 500 according to an embodiment of the invention. As shown in FIG. 5, the ring oscillator 500 with an input node NIN5 and an output node NOUT5 includes a plurality of inverters 510-1, . . . , and 510-R ("R" is an even number which is equal to or greater than 2), and a control gate 520. A closed loop structure is formed by cascading the inverters 510-1, . . . , and 510-R. The control gate 520 is embedded in the closed loop structure of the inverters 510-1, . . . , and 510-R. The control gate 520 is configured to selectively enable or disable the ring oscillator 500. For example, the control gate 520 may be implemented with a NAND gate, which has a first input terminal coupled to the output terminal of the inverter 510-R, and a second input terminal for receiving an enable signal EN5 at the input node NIN5. If the enable signal EN5 has a high logic level (i.e., the logic level "1"), the ring oscillator 500 will be enabled and generate an output signal SOUT5 at the output node NOUT5; and conversely, if the enable signal EN5 has a low logic level (i.e., the logic level "0"), the ring oscillator 500 will be disabled and stop generating the output signal SOUT5. In alternative embodiments, the control gate 520 is implemented with a different logic gate, such as an AND gate, an OR gate, or an NOR gate, and the number and arrangement of inverters 510-1, ..., and 510-R are adjusted correspondingly. The inverters 510-1, ..., and 510-R include at least one sensitive inverter with a diode-connected transistor. In some embodiments, each of the inverters 510-1, ..., and 510-R is implemented with a respective sensitive inverter. The sensitive inverter may be the N-type inverter 100 or the P-type inverter 200. The structures and functions of the N-type inverter 100 and the P-type inverter 200 have been described in the embodiments of FIG. 1 and FIG. 2. Ideally, each of the inverters 510-1, ..., and 510-R have the same MOSFET threshold voltage. As mentioned above, the sensitive inverter is sensitive to the variation in the MOSFET threshold voltage (e.g., $V_{tN}$ or $|V_{tP}|$). Therefore, the variation in the MOSFET threshold voltage of the ring oscillator 500 is detected by monitoring and analyzing an oscillation frequency of the ring oscillator 500. The oscillation frequency of the ring oscillator 500 may be a frequency of the output signal SOUT5 at the output node NOUT5. It should be noted that the aforementioned oscillation frequency of the ring oscillator 500 may be proportional to the reciprocal of the total delay time of the inverters 510-1, ..., and 510-R, and the control gate 520. Specifically, if the oscillation frequency of the ring oscillator 500 increases, it may mean that the MOSFET threshold voltage becomes lower so that the charging/discharging current of the sensitive inverter becomes larger; otherwise, if the oscillation frequency of the ring oscillator 500 decreases, it may mean that the MOSFET threshold voltage becomes higher so that the charging/discharging current of the sensitive inverter becomes smaller.

Figure 6:
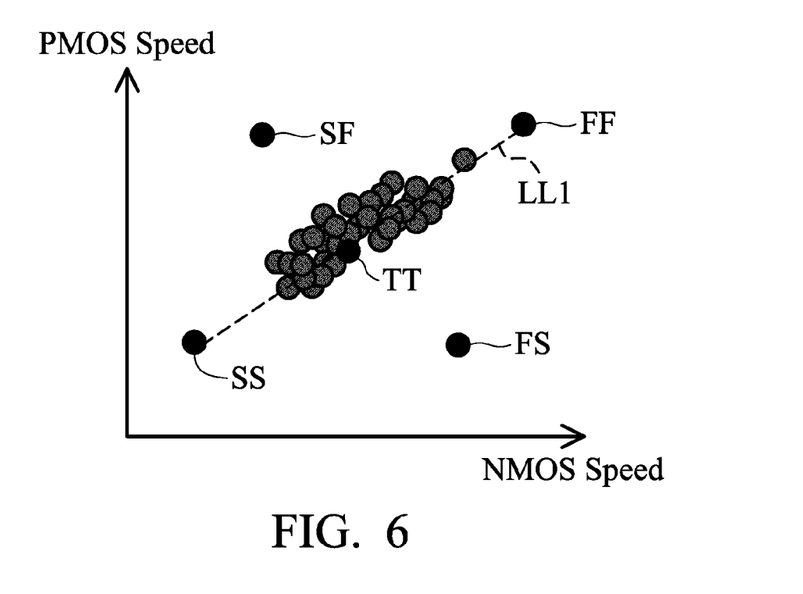
FIG. 6 is a diagram of MOSFET (Metal Oxide Semiconductor Field Effect Transistor) operation speed according to an embodiment of the invention.

FIG. 6 is a diagram of the MOSFET operation speed according to an embodiment of the invention. The horizontal axis represents the operation speed of the NMOS transistor, and the vertical axis represents the operation speed of the PMOS transistor. In any integrated circuit, there are five possible measurement results relative to the MOSFET operation speed. A first case, indicated by a first black circle TT, means that the switching operation of NMOS transistor is typical and the switching operation of the PMOS transistor is also typical (ideal case). A second case, indicated by a second black circle FF, means that the switching operation of NMOS transistor is fast and the switching operation of the PMOS transistor is also fast. A third case, indicated by a third black circle SS, means that the switching operation of NMOS transistor is slow and the switching operation of the PMOS transistor is also slow. A fourth case, indicated by a fourth black circle SF, means that the switching operation of NMOS transistor is slow but the switching operation of the PMOS transistor is fast. A fifth case, indicated by a fifth black circle FS, means that the switching operation of NMOS transistor is fast but the switching operation of the PMOS transistor is slow. The above different MOSFET operation speeds may result from the variation in the MOSFET threshold voltage. For example, the PMOS transistor and the NMOS transistor may have different threshold voltages, and the variations in their threshold voltages may be also different. A conventional process monitor can merely distinguish the MOSFET operation speed in the first case, the second case, and the third case. For example, a plurality of gray circles may represent the detection results of the conventional process monitor, and they may be substantially distributed along a straight line LL1, which connects the second black circle FF through the first black circle TT to the third black circle SS but is away from the fourth black circle SF and the fifth black circle FS. In other words, it is difficult for the conventional process monitor to distinguish between the fourth case and the fifth case, in which the NMOS transistor and the PMOS transistor have inconsistent operation speeds.

Figure 7:
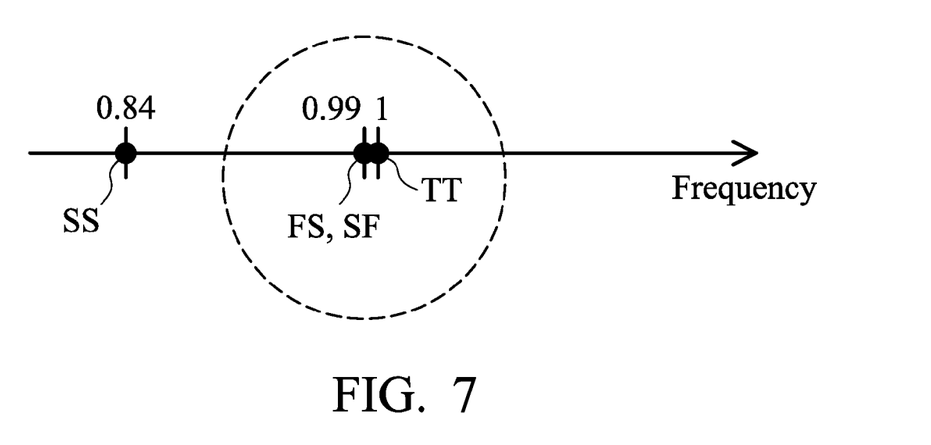
FIG. 7 is a diagram of an oscillation frequency of a conventional ring oscillator used as a process monitor.

FIG. 7 is a diagram of the oscillation frequency of a conventional ring oscillator used as the process monitor. When a conventional process monitor is used to detect the MOSFET operation speed, the first case (i.e., typical NMOS and typical PMOS, indicated by the first black circle TT), the fourth case (i.e., slow NMOS but fast PMOS, indicated by the fourth black circle SF), and the fifth case (i.e., fast NMOS but slow PMOS, indicated by the fifth black circle FS) correspond to three very close oscillation frequency points (e.g., 1, 0.99, and 0.99) over the frequency axis, respectively. That is, it is not easy for the conventional process monitor to distinguish the fourth case and the fifth case from the first case.

Figure 8:
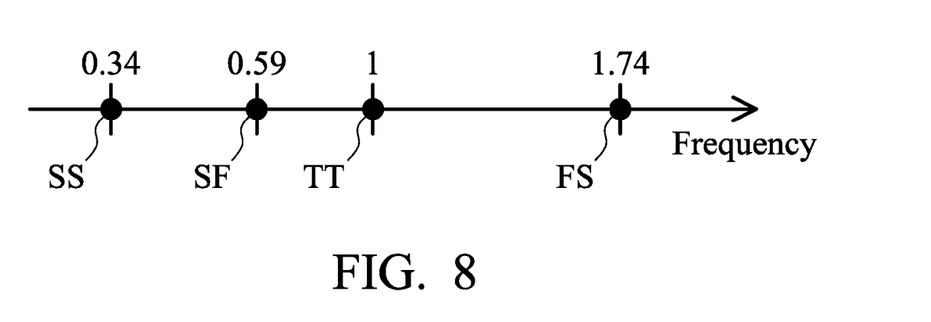
FIG. 8 is a diagram of an oscillation frequency of the proposed ring oscillator used as a process monitor according to an embodiment of the invention.

FIG. 8 is a diagram of the oscillation frequency of the proposed ring oscillator 500 used as the process monitor according to an embodiment of the invention. When the proposed ring oscillator 500 is used to detect the MOSFET operation speed, the first case (i.e., typical NMOS and typical PMOS, indicated by the first black circle TT), the fourth case (i.e., slow NMOS but fast PMOS, indicated by the fourth black circle SF), and the fifth case (i.e., fast NMOS but slow PMOS, indicated by the fifth black circle FS) correspond to three separate oscillation frequency points (e.g., 1, 0.59, and 1.74) over the frequency axis, respectively. In comparison to the conventional design, the proposed ring oscillator 500 can easily distinguish the fourth case and the fifth case from the first case because it includes the sensitive inverter which is more sensitive to the variation in the MOSFET threshold voltage than the conventional design.

The invention proposes a novel apparatus for detecting the MOSFET threshold voltage, and the apparatus may be implemented with an inverter, a delay chain, or a ring oscillation. The proposed apparatus includes at least one sensitive inverter which is sensitive to the variation in the MOSFET threshold voltage. Accordingly, the proposed apparatus configured as a process monitor can detect the MOSFET operation speed accurately even if the PMOS transistor and the NMOS transistor have inconsistent operation speeds. In comparison to the conventional design, the invention has at least the advantages of fast and precise detection and simple circuit structure.

The above parameters are just exemplary, rather than limitations of the invention. One of ordinary skill may adjust these settings according to different requirements. It should be understood that the proposed inverter, delay chain, and ring oscillator are not limited to the configurations of FIGS. 1-8. The invention may merely include any one or more features of any one or more embodiments of FIGS. 1-8. In other words, not all of the features shown in the figures should be implemented in the proposed inverter, delay chain, and ring oscillator of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A delay chain, comprising:
    a plurality of inverters, coupled in series, and comprising at least one sensitive inverter with a diode-connected transistor;
    wherein the sensitive inverter is a P-type inverter;
    wherein the P-type inverter comprises:
        a first PMOS transistor (P-type Metal Oxide Semiconductor Field Effect Transistor), wherein the first PMOS transistor has a control terminal coupled to an inner node, a first terminal coupled to a supply voltage, and a second terminal coupled to the inner node;
        a second PMOS transistor, wherein the second PMOS transistor has a control terminal coupled to an input node of the P-type inverter, a first terminal coupled to the inner node, and a second terminal coupled to an output node of the P-type inverter; and
        an NMOS transistor (N-type Metal Oxide Semiconductor Field Effect Transistor), wherein the NMOS transistor has a control terminal coupled to the input node, a first terminal coupled to a ground voltage, and a second terminal coupled to the output node;
    wherein a variation in an MOSFET (Metal Oxide Semiconductor Field Effect Transistor) threshold voltage of the delay chain is detected by analyzing a total delay time of the delay chain.

2. The delay chain as claimed in claim 1, wherein each of the inverters is implemented with the sensitive inverter.

3. The delay chain as claimed in claim 1, wherein if the total delay time of the delay chain increases, it means that the MOSFET threshold voltage becomes higher, and if the total delay time of the delay chain decreases, it means that the MOSFET threshold voltage becomes lower.

4. A ring oscillator, comprising:
    a plurality of inverters, comprising at least one sensitive inverter with a diode-connected transistor, wherein a closed loop structure is formed by cascading the inverters;
    wherein the sensitive inverter is a P-type inverter;
    wherein the P-type inverter comprises:
        a first PMOS transistor (P-type Metal Oxide Semiconductor Field Effect Transistor), wherein the first PMOS transistor has a control terminal coupled to an inner node, a first terminal coupled to a supply voltage, and a second terminal coupled to the inner node;
        a second PMOS transistor, wherein the second PMOS transistor has a control terminal coupled to an input node of the P-type inverter, a first terminal coupled to the inner node, and a second terminal coupled to an output node of the P-type inverter; and
        an NMOS transistor (N-type Metal Oxide Semiconductor Field Effect Transistor), wherein the NMOS transistor has a control terminal coupled to the input node, a first terminal coupled to a ground voltage, and a second terminal coupled to the output node;
    wherein a variation in an MOSFET (Metal Oxide Semiconductor Field Effect Transistor) threshold voltage of the ring oscillator is detected by analyzing an oscillation frequency of the ring oscillator.

5. The ring oscillator as claimed in claim 4, wherein each of the inverters is implemented with the sensitive inverter.

6. The ring oscillator as claimed in claim 4, further comprising:
    a control gate, embedded in the closed loop structure of the inverters, wherein the control gate is configured to selectively enable or disable the ring oscillator.

7. The ring oscillator as claimed in claim 4, wherein if the oscillation frequency of the ring oscillator increases, it means that the MOSFET threshold voltage becomes lower, and if the oscillation frequency of the ring oscillator decreases, it means that the MOSFET threshold voltage becomes higher.

* * * * *